United States Patent
Liu et al.

(10) Patent No.: US 9,268,375 B2
(45) Date of Patent: Feb. 23, 2016

(54) POWER DISTRIBUTION IN SEMICONDUCTOR DEVICE

(71) Applicant: TAIWAN SEMICONDUCTOR MANUFACTURING CO., LTD., Hsinchu (TW)

(72) Inventors: Jack Liu, Taipei (TW); Chun-Cheng Ku, Zhubei (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 222 days.

(21) Appl. No.: 13/962,619

(22) Filed: Aug. 8, 2013

(65) Prior Publication Data

US 2015/0042382 A1 Feb. 12, 2015

(51) Int. Cl.
*G06F 1/18* (2006.01)
*H01L 23/522* (2006.01)
*H01L 23/528* (2006.01)

(52) U.S. Cl.
CPC ............... *G06F 1/189* (2013.01); *H01L 23/522* (2013.01); *H01L 23/5286* (2013.01); *H01L 2924/0002* (2013.01)

(58) Field of Classification Search
CPC . H03K 3/0375; H03K 5/1565; H03K 17/165; H03K 19/003; H03K 5/00; H03K 5/086; H03K 5/131; G11C 7/22; G11C 7/04; G11C 16/10; G11C 7/10; G11C 7/1066; G06F 1/10; G06F 11/1441; G06F 12/00; G06F 1/28; G06F 1/30
USPC .......................................... 326/93, 94, 95, 96
See application file for complete search history.

(56) References Cited

U.S. PATENT DOCUMENTS

2009/0066160 A1* 3/2009 Katoh .............................. 307/43
2010/0026345 A1* 2/2010 Li .................................. 326/93

* cited by examiner

*Primary Examiner* — John Poos
(74) *Attorney, Agent, or Firm* — McDermott Will & Emery LLP

(57) ABSTRACT

A semiconductor device is disclosed that includes a clock signal distribution network and a logic circuitry. The clock signal distribution network is configured to receive a first power. The logic circuitry is configured to receive a second power independent from the first power.

18 Claims, 3 Drawing Sheets

POWER DISTRIBUTION IN SEMICONDUCTOR DEVICE

FIELD

The present disclosure relates to power distribution in semiconductor devices.

BACKGROUND

Supplying power to a semiconductor device causes a power voltage drop (also called IR drop) between two points of a power grid used in some approaches. Due to the IR drop, power supply noise is generated. As a result, noise, which is characterized as jitter, is generated. Therefore, clock jitter occurs in clock signals due to the noise, and thus results in performance degradation of the semiconductor device.

BRIEF DESCRIPTION OF THE DRAWINGS

The disclosure can be more fully understood by reading the following detailed description of various embodiments, with reference to the accompanying drawings as follows.

DETAILED DESCRIPTION

In the following description, specific details are presented to provide a thorough understanding of the embodiments of the present disclosure. Persons of ordinary skill in the art will recognize, however, that the present disclosure can be practiced without one or more of the specific details, or in combination with other components. Well-known implementations or operations are not shown or described in detail to avoid obscuring aspects of various embodiments of the present disclosure.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

It will be understood that, although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

As used herein, the terms "comprising," "including," "having," "containing," "involving," and the like are to be understood to be open-ended, i.e., to mean including but not limited to.

Reference throughout the specification to "one embodiment" or "an embodiment" means that a particular feature, structure, implementation, or characteristic described in connection with the embodiment is included in at least one embodiment of the present disclosure. Thus, uses of the phrases "in one embodiment" or "in an embodiment" in various places throughout the specification are not necessarily all referring to the same embodiment. Furthermore, the particular features, structures, implementation, or characteristics may be combined in any suitable manner in one or more embodiments.

Figure 1:
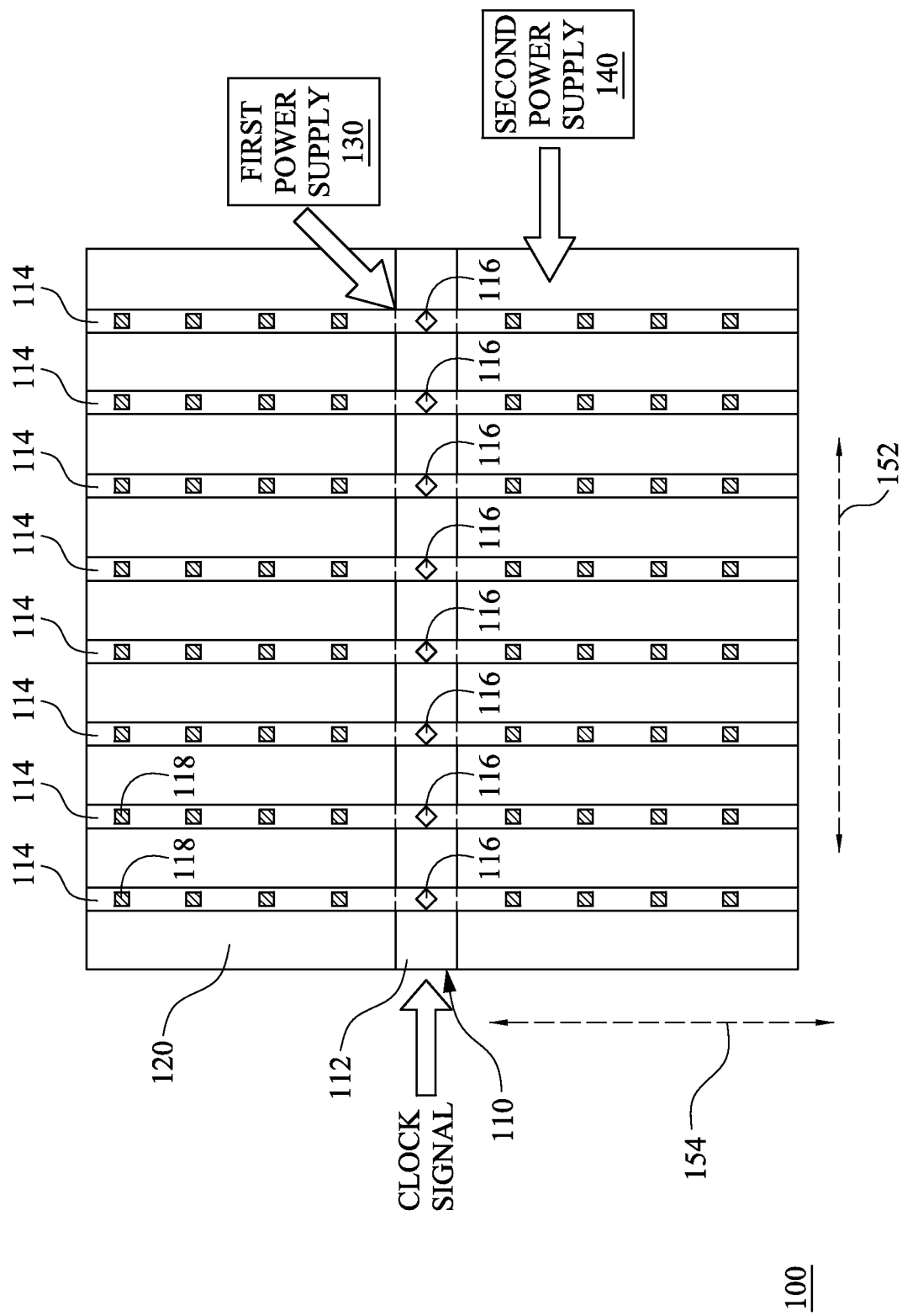
FIG. 1 is a schematic diagram of a semiconductor device in accordance with some embodiments of the present disclosure.

FIG. 1 is a schematic diagram of a semiconductor device 100 in accordance with some embodiments of the present disclosure.

In the semiconductor device 100, a clock signal distribution network 110 and a logic circuitry 120 are provided. The clock signal distribution network 110 includes a first clock spine 112 and a plurality of second clock spines 114. In some embodiments, the first clock spine 112 is a horizontal spine, and each one of the second clock spines 114 is a vertical spine. The logic circuitry 120 in FIG. 1 is labeled for a general reference. Regions in FIG. 1 other than the first clock spine 112 and the second clock spines 114 belong to the logic circuitry 120.

The clock signal distribution network 110 is configured to carry and distribute clock signals or clock-type signals. In various embodiments, the clock signal distribution network 110 is configured to distribute clock signals for the logic circuitry 120 to function.

The clock signal distribution network 110 is configured to receive a first power supplied from a first power supply 130. The logic circuitry 120 is configured to receive a second power supplied from a second power supply 140. The first power supply 130 is independent from the second power supply 140. As a result, the first power for the clock signal distribution network 110 is independent from the second power for the logic circuitry 120.

In some embodiments, outputs of the first clock spine 112 are connected to inputs of the second clock spines 114 at regions 116. Explained in a different way, each one of the regions 116 is configured as a corresponding output of the first clock spine 112, and is also configured as an input of a corresponding second clock spine 114. As a result, the second clock spines 114 carry the clock signal from the first clock spine 112.

In some embodiments, each of the second clock spines 114 has a number of outputs 118. Two outputs 118 in FIG. 1 are labeled for a general reference. Other regions similar to the labeled outputs 118 also indicate the outputs of the second clock spines 114.

In some embodiments, the first clock spine 112 is formed in a first direction 152 which, as illustratively shown in FIG. 1, is a horizontal direction. The second clock spines 114 are formed in a second direction 154 which, as illustrated in FIG. 1, is a vertical direction. Various directions of the first clock spine 112 and the second clock spines 114 are within the contemplated scope of the present disclosure.

The layout of the clock signal distribution network 110 and the logic circuitry 120 in FIG. 1 is for illustrative purposes. Other types of layouts are within the contemplated scope of the present disclosure. Furthermore, various circuitry or elements other than the clock signal distribution network 110 and the logic circuitry 120 in the semiconductor device 100 are also within the contemplated scope of the present disclosure.

The first clock spine 112 and the second clock spines 114 in FIG. 1 are given for illustrative purposes. Various numbers and configurations of the first clock spine 112 and the second clock spines 114 are within the contemplated scope of the present disclosure.

Figure 2:
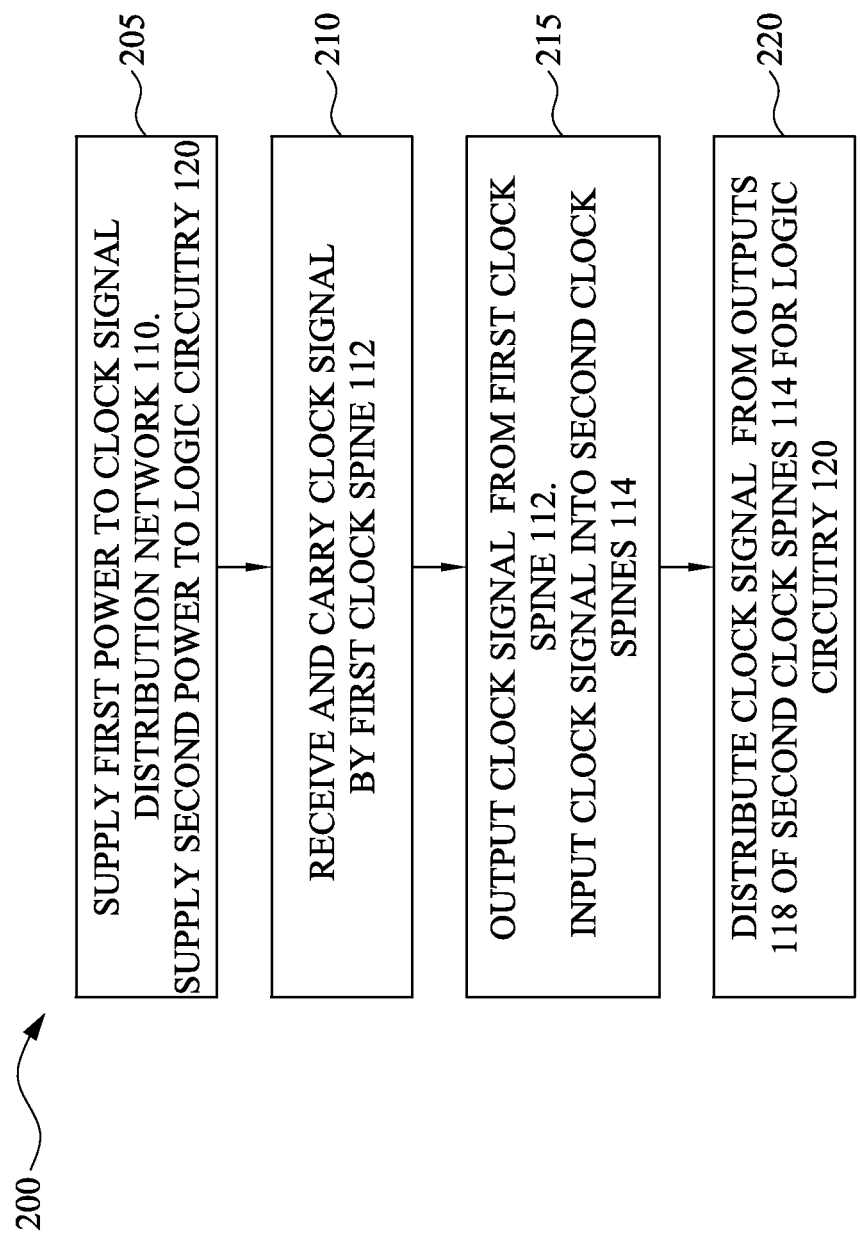
FIG. 2 is a flow chart of a method illustrating operations of the semiconductor device in FIG. 1, in accordance with some embodiments of the present disclosure.

FIG. 2 is a flow chart of a method 200 illustrating operations of the semiconductor device 100 in FIG. 1, in accordance with some embodiments of the present disclosure. The method 200 is described below with reference to the semiconductor device 100 in FIG. 1.

In operation 205, the first power from the first power supply 130 is supplied to the clock signal distribution network 110. Therefore, the first clock spine 112 and the second clock spines 114 receive the first power from the first power supply 130. Moreover, the second power from the second power supply 140 is supplied to the logic circuitry 120.

In various embodiments, the first power supply 130 is not independent from the second power supply 140, but operates together with the second power supply 140 as a common power supply. Alternatively stated, compared with the operation 205 in FIG. 2, a common power is supplied to the clock signal distribution network 110 and the logic circuitry 120. As a result, the first clock spine 112, the second clock spines 114, and the logic circuitry 120 receive the common power.

In operation 210, a clock signal is received and carried by the first clock spine 112.

In operation 215, the clock signal is outputted from the first clock spine 112, and is inputted into the second clock spines 114 at the regions 116. As a result, the clock signal is carried by each corresponding second clock spine 114.

In operation 220, the clock signal is distributed from the outputs 118 of the second clock spines 114 for the logic circuitry 120 to function.

Figure 3:
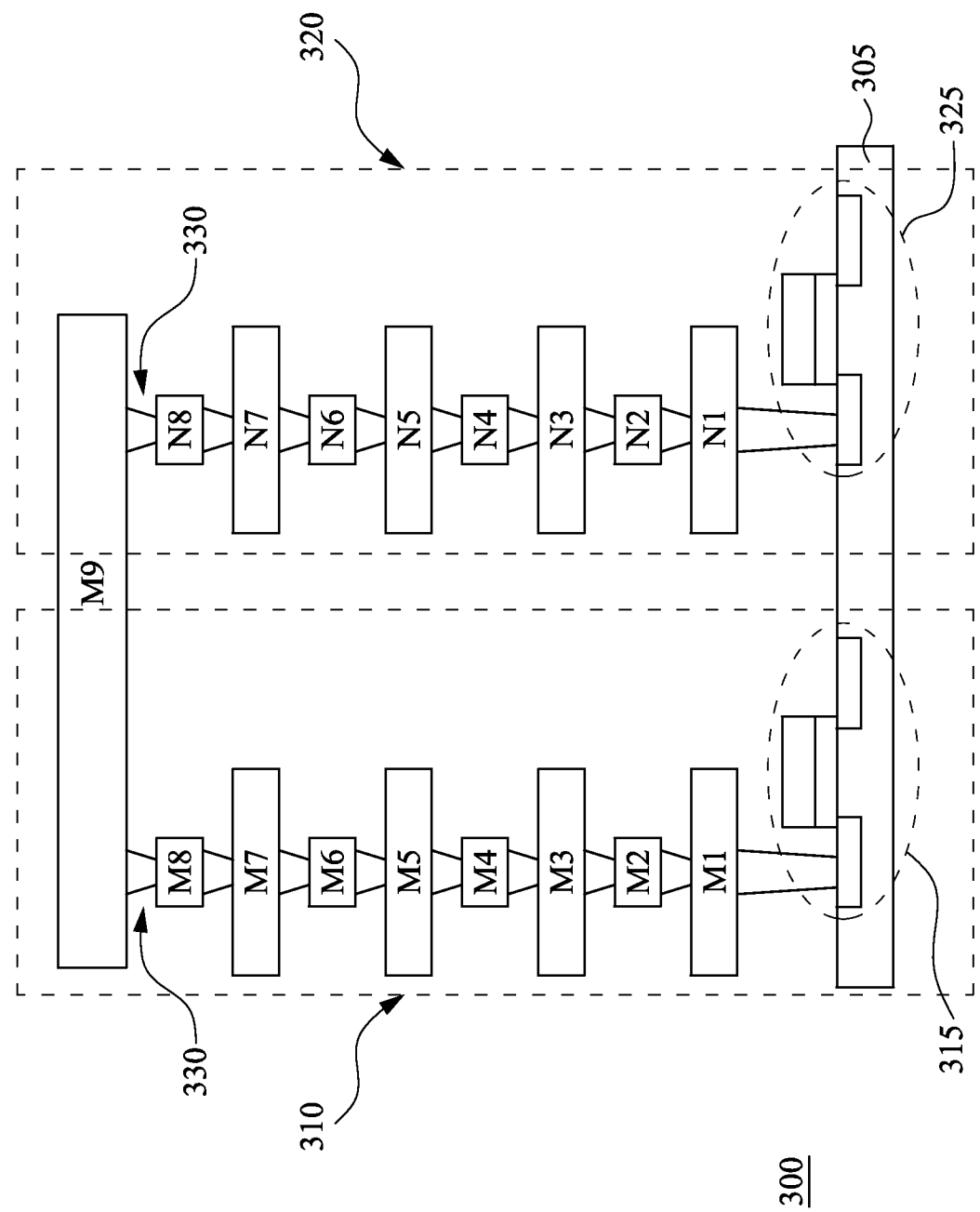
FIG. 3 is a schematic diagram of a semiconductor structure in the semiconductor device in FIG. 1, in accordance with some embodiments of the present disclosure.

FIG. 3 is a schematic diagram of a semiconductor structure 300 in the semiconductor device 100 in FIG. 1, in accordance with some embodiments of the present disclosure. For illustration, the semiconductor structure 300 in FIG. 3 is supplied by the common power.

In FIG. 3, a first portion 310 and a second portion 320 are formed on a substrate 305. For illustration, the first portion 310 represents an illustrative structure in the first clock spine 112 or one of the second clock spines 114 in FIG. 1. The second portion 320 represents an illustrative structure in the logic circuitry 120 in FIG. 1.

For the first portion 310, metal layers M1-M8 and a first component 315 are provided. The metal layers M1-M8 are stacked together by vias 330 on the substrate 305. For simplicity, two vias 330 are labeled. Structures drawn similar to the labeled vias 330 are also vias 330.

In some embodiments, the first component 315 is a clock driver.

For the second portion 320, metal layers N1-N8 and a second component 325 are provided. The metal layers N1-N8 are stacked together through the vias 330 on the substrate 305. In some embodiments, the second component 325 is a logic component which, in further embodiments, is a logic transistor.

The metal layers M1-M8 are each separate from the corresponding metal layers N1-N8. Explained in a different way, each metal layer of the metal layers M1-M8 is separate from a corresponding metal layer of the metal layers N1-N8.

In various embodiments, several metal layers in the first portion 310 are connected to several metal layers in the second portion 320. One or more of the metal layers M1-M8 is connected to the corresponding one or more of the metal layers N1-N8. For example, the metal layer M8 is connected to the metal layer N8, and the metal layers M1-M7 are separate from the metal layers N1-N7. For another example, the metal layers M7 and M8 are connected to the metal layers N7 and N8, respectively, and the metal layers M1-M6 are separate from the metal layers N1-N6. For yet another example, the metal layers M6-M8 are connected to the metal layers N6-N8, respectively, and the metal layers M1-M5 are separate from the metal layers N1-N5, etc.

The stacked metal layers M1-M8 and N1-N8 are connected with a common metal layer M9. As a result, the first portion 310 and the second portion 320 are connected together. In some embodiments, the first portion 310 and the second portion 320 both include and share the common metal layer M9.

In operation, the common power is supplied to the common metal layer M9. The common power is carried by the metal layers M1-M8 through the common metal layer M9. The common power is supplied through the metal layers M1-M8 for the first component 315 to function. Similarly, the common power is carried by the metal layers N1-N8 through the common metal layer M9. The common power is supplied through the metal layers N1-N8 for the second component 325 to function.

In some other embodiments, compared with the semiconductor structure 300 in FIG. 3, the first portion 310 and the second portion 320 are not connected by the common metal layer M9, but are separate from each other. In further embodiments, the metal layer M9 includes two pieces that are not connected together. The two pieces of the metal layer M9 are each stacked with the metal layers M8 and N8. In operation, with reference to FIG. 1 and FIG. 3, the first power supply 130 and the second power supply 140 supply power through the two pieces of the metal layer M9 to the first portion 310 and the second portion 320, respectively.

The semiconductor structure 300 is for illustrative purposes. Various configurations of the semiconductor structure 300 are within the contemplated scope of the present disclosure. Layers and/or components other than those illustratively shown in FIG. 3 are also within the contemplated scope of the present disclosure.

Based on the embodiments with reference to FIG. 1, because the clock signal distribution network 110 is supplied with power from the independent first power supply 130, the power voltage drop (also called IR drop) between two points of a power grid in the present disclosure is reduced, compared with other approaches using the common power supply. Power supply noise is accordingly decreased because IR drop is reduced. Therefore, jitter corresponding to power supply noise is decreased. As a result, clock jitter in clock signals is reduced.

Moreover, as illustratively shown in FIG. 3, the clock signal distribution network 110 and the logic circuitry 120 in FIG. 1 are supplied with the common power through the common metal layer M9 stacked with separate metal layers M1-M8 and N1-N8. Therefore, the IR drop is also reduced, compared with some other approaches using all common metal layers, because the IR drop increases when the power is supplied through all common metal layers.

In some embodiments, a semiconductor device is disclosed that includes a clock signal distribution network and a logic circuitry. The clock signal distribution network is configured to receive a first power. The logic circuitry is configured to receive a second power independent from the first power.

Also disclosed is a semiconductor device that includes a clock signal distribution network and a logic circuitry. The clock signal distribution network includes at least one first clock spine, and the at least one first clock spine includes a plurality of first metal layers. The logic circuitry includes a plurality of second metal layers. The at least one first clock spine and the logic circuitry includes at least one common metal layer, and each first metal layer of the plurality of first metal layers is separate from a corresponding second metal layer of the plurality of second metal layers.

A method is also disclosed in which a first power is supplied to a clock signal distribution network, a second power is supplied to a logic circuitry, and the second power is independent from the first power.

A method is further disclosed in which a plurality of first metal layers are formed in at least one first clock spine of a clock signal distribution network, a plurality of second metal layers are formed in a logic circuitry in which the plurality of first metal layers are separate from the plurality of second metal layers, and at least one common metal layer stacked with the plurality of first metal layers and the plurality of second metal layers is formed.

In this document, the term "coupled" may be termed as "electrically coupled", and the term "connected" may be termed as "electrically connected". "Coupled" and "connected" may also be used to indicate that two or more elements cooperate or interact with each other.

The term "logic circuitry" in this document includes any type of functional element other than clock-type elements.

The term "clock spine" in this document includes a channel configured to transmit clock signals, and also includes clock drivers configured to distribute the clock signals. Moreover, the term "clock spine" in this document is used to indicate the regions other than the logic circuitry.

The above illustrations include exemplary operations, but the operations are not necessarily performed in the order shown. Operations may be added, replaced, changed order, and/or eliminated as appropriate, in accordance with the spirit and scope of various embodiments of the present disclosure.

As is understood by one of ordinary skill in the art, the foregoing embodiments of the present disclosure are illustrative of the present disclosure rather than limiting of the present disclosure. It is intended to cover various modifications and similar arrangements included within the spirit and scope of the appended claims, the scope of which should be accorded with the broadest interpretation so as to encompass all such modifications and similar structures.

What is claimed is:

1. A semiconductor device comprising:
   a clock signal distribution network configured to receive a first power; and
   a logic circuitry configured to receive a second power independent from the first power;
   wherein the clock signal distribution network comprises:
      a first clock spine comprising a plurality of outputs; and
      a plurality of second clock spines, wherein each second clock spine of the plurality of second clock spines comprises an input connected to an output of the plurality of outputs.

2. The semiconductor device of claim 1, further comprising:
   a power supply configured to supply the first power to the clock signal distribution network.

3. The semiconductor device of claim 1, further comprising:
   a first power supply configured to supply the first power; and
   a second power supply configured to supply the second power;
   wherein the second power supply is independent from the first power supply.

4. The semiconductor device of claim 1, wherein the second clock spine is configured to carry a clock signal from the first clock spine.

5. The semiconductor device of claim 4, wherein the first clock spine is formed in a first direction, the plurality of second clock spines are formed in a second direction different from the first direction.

6. The semiconductor device of claim 1, wherein
   the clock signal distribution network comprises a plurality of first metal layers configured to carry the first power;
   the logic circuitry comprises a plurality of second metal layers configured to carry the second power; and
   the plurality of first metal layers are separate from the plurality of second metal layers.

7. A semiconductor device comprising:
   a clock signal distribution network comprising at least one first clock spine, the at least one first clock spine comprising a plurality of first metal layers; and
   a logic circuitry comprising a plurality of second metal layers;
   wherein the at least one first clock spine and the logic circuitry comprise at least one common metal layer, and
   each first metal layer of the plurality of first metal layers is separate from a corresponding second metal layer of the plurality of second metal layers.

8. The semiconductor device of claim 7, wherein the at least one common metal layer is stacked with the plurality of first metal layers and the plurality of second metal layers.

9. The semiconductor device of claim 7, wherein the clock signal distribution network further comprises:
   at least one second clock spine configured to carry a clock signal from the at least one first clock spine.

10. The semiconductor device of claim 9, wherein the at least one first clock spine is formed in a first direction, the at least one second clock spine is formed in a second direction different from the first direction.

11. The semiconductor device of claim 7, wherein
    the at least one first clock spine has a plurality of outputs;
    the clock signal distribution network further comprises a plurality of second clock spines; and
    each second clock spine of the plurality of second clock spines has an input connected to an output of the plurality of outputs.

12. The semiconductor device of claim 7, wherein the clock signal distribution network and the logic circuitry are configured to receive a common power.

13. A method comprising:
    supplying a first power to a clock signal distribution network;
    supplying a second power to a logic circuitry; and
    transmitting a clock signal from at least one first clock spine of the clock signal distribution network to a plurality of second clock spines of the clock signal distribution network,
    wherein the second power is independent from the first power.

14. The method of claim 13, further comprising:
    carrying a clock signal by the at least one first clock spine of the clock signal distribution network; and
    carrying the clock signal from the at least one first clock spine, by the plurality of second clock spines of the clock signal distribution network.

15. The method of claim 13, wherein
    the first power in the clock signal distribution network is carried by a plurality of first metal layers;
    the second power in the logic circuitry is carried by a plurality of second metal layers; and
    the plurality of first metal layers are separate from the plurality of second metal layers.

16. A method comprising:
forming a plurality of first metal layers in at least one first clock spine of a clock signal distribution network;
forming a plurality of second metal layers in a logic circuitry, wherein the plurality of first metal layers are separate from the plurality of second metal layers; and
forming at least one common metal layer stacked with the plurality of first metal layers and the plurality of second metal layers.

17. The method of claim 16, wherein a common power is supplied by through the at least one common metal layer to the clock signal distribution network and the logic circuitry.

18. The method of claim 16, wherein a clock signal is transmitted from a first clock spine of the clock signal distribution network to a plurality of second clock spines of the clock signal distribution network.

* * * * *